US012677650B2

(12) United States Patent
Chiu et al.

(10) Patent No.: US 12,677,650 B2
(45) Date of Patent: Jul. 7, 2026

(54) SEMICONDUCTOR STRUCTURES AND METHOD FOR MANUFACTURING A SEMICONDUCTOR STRUCTURE

(71) Applicant: SERIPHY TECHNOLOGY CORPORATION, Hsinchu County (TW)

(72) Inventors: Tzu-Wei Chiu, Hsinchu County (TW); Chun-Wei Chang, Taipei City (TW); Wei-Chih Chen, Taoyuan City (TW); Che-Yen Huang, Hsinchu County (TW)

(73) Assignee: SERIPHY TECHNOLOGY CORPORATION, Hsinchu County (TW)

( * ) Notice: Subject to any disclaimer, the term of this patent is extended or adjusted under 35 U.S.C. 154(b) by 373 days.

(21) Appl. No.: 18/340,873

(22) Filed: Jun. 25, 2023

(65) Prior Publication Data

US 2024/0312874 A1     Sep. 19, 2024

Related U.S. Application Data

(60) Provisional application No. 63/490,768, filed on Mar. 16, 2023.

(51) Int. Cl.
H10W 20/20        (2026.01)
H10D 1/66         (2025.01)
(Continued)

(52) U.S. Cl.
CPC ............ H10W 20/20 (2026.01); H10D 1/665 (2025.01); H10W 70/611 (2026.01);
(Continued)

(58) Field of Classification Search
CPC .............. H01L 23/481; H01L 23/3121; H01L 23/49811; H01L 23/5386; H01L 24/08; H01L 24/32; H01L 25/0657; H10D 1/665
See application file for complete search history.

(56) References Cited

U.S. PATENT DOCUMENTS

2015/0250058 A1* 9/2015 Ramachandran ..... H01L 25/065
                                                      361/748
2016/0095221 A1* 3/2016 Ramachandran .... H05K 3/4038
                                                      361/783
(Continued)

*Primary Examiner* — Eugene Lee
(74) *Attorney, Agent, or Firm* — WPAT, P.C.; Anthony King

(57)                    ABSTRACT

A semiconductor structure includes a substrate, a through via penetrating the substrate, a trench capacitor, a first redistribution layer (RDL), a second RDL, and a contact feature. The trench capacitor extends from a back surface toward a front surface of the substrate, wherein the trench capacitor is separated from an active area at the front surface of the substrate. The first RDL is disposed over the front surface and electrically connecting to the through via, wherein the active area is disposed between the trench capacitor and the first RDL. The second RDL is disposed over the back surface and electrically connecting to the through via and the trench capacitor. The contact feature is disposed over the first RDL and electrically connecting to the trench capacitor through the first RDL, the through via and the second RDL. A method of manufacturing the semiconductor structure is also provided.

20 Claims, 31 Drawing Sheets

(51) Int. Cl.

| | |
|---|---|
| *H10W 70/60* | (2026.01) |
| *H10W 70/65* | (2026.01) |
| *H10W 74/10* | (2026.01) |
| *H10W 90/00* | (2026.01) |
| *H10W 74/00* | (2026.01) |
| *H10W 80/00* | (2026.01) |
| *H10W 90/20* | (2026.01) |

(52) U.S. Cl.
CPC .......... *H10W 70/65* (2026.01); *H10W 74/114* (2026.01); *H10W 90/00* (2026.01); *H10W 90/701* (2026.01); *H10W 74/00* (2026.01); *H10W 80/721* (2026.01); *H10W 90/297* (2026.01); *H10W 90/732* (2026.01); *H10W 90/794* (2026.01)

(56) References Cited

U.S. PATENT DOCUMENTS

| | | | | |
|---|---|---|---|---|
| 2020/0402892 | A1* | 12/2020 | Chen ................... | H01L 25/0657 |
| 2022/0223530 | A1* | 7/2022 | Yu ......................... | H01L 24/16 |
| 2022/0262778 | A1* | 8/2022 | Yu ......................... | H01L 25/50 |
| 2022/0367267 | A1* | 11/2022 | Yu ......................... | H01L 25/18 |
| 2023/0040618 | A1* | 2/2023 | Chang ................... | H10D 86/85 |
| 2023/0060324 | A1* | 3/2023 | Liu ....................... | H10D 1/716 |
| 2023/0071418 | A1* | 3/2023 | Hung ................... | H01L 23/528 |
| 2023/0307374 | A1* | 9/2023 | Ting ...................... | H01L 23/64 |
| 2024/0063182 | A1* | 2/2024 | Jeng ...................... | H01L 25/16 |

* cited by examiner

101

102

131

132

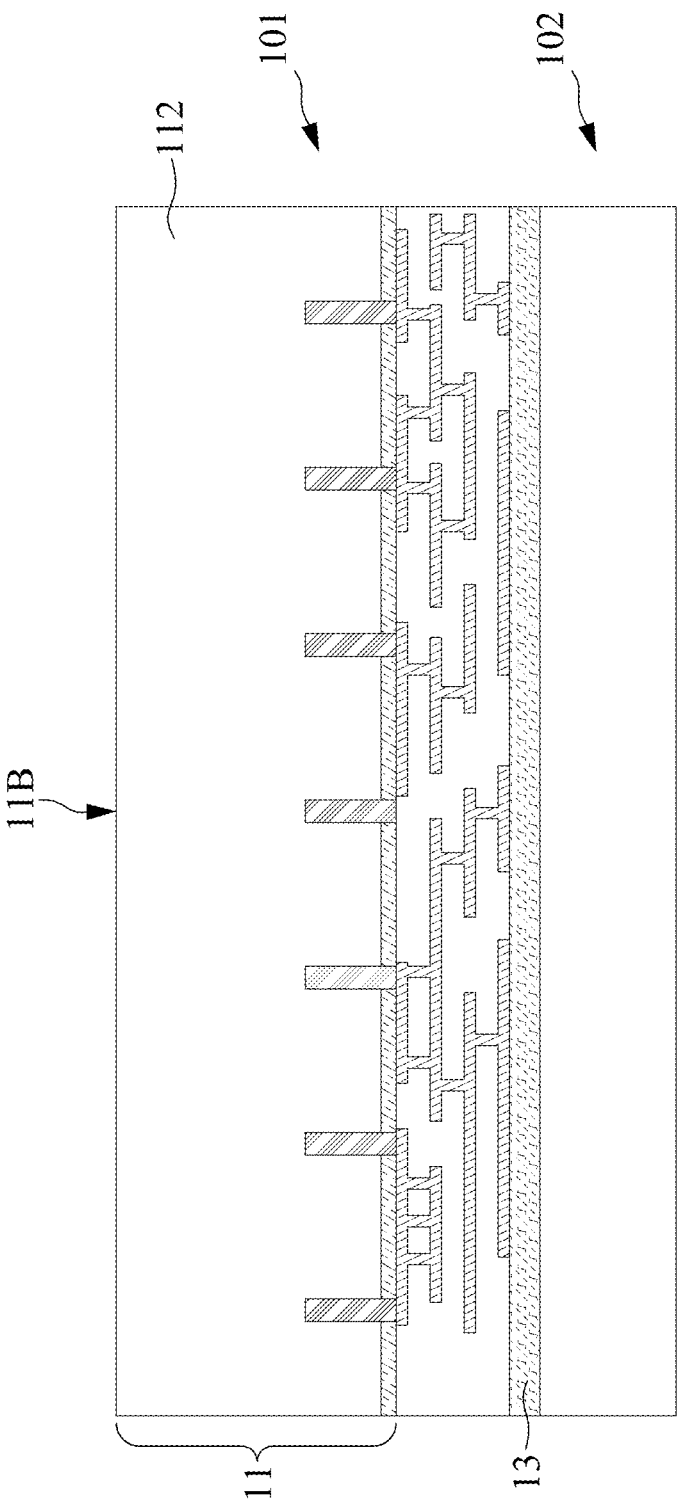
FIG. 6
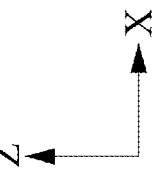

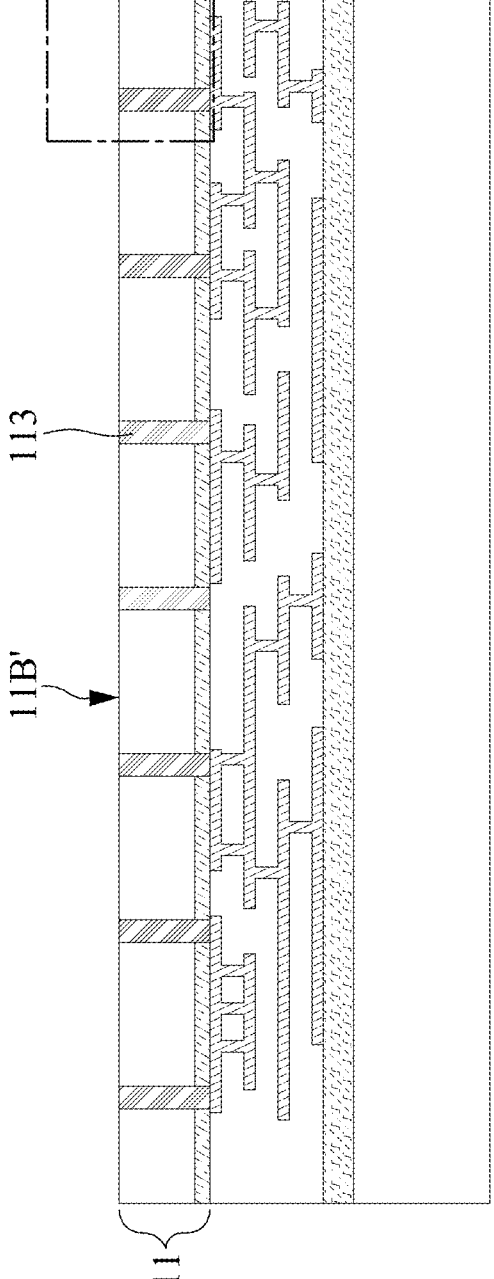
FIG. 7
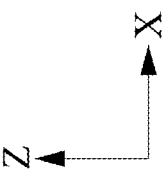

15
152c
152b
144
152a
123
115
114
153
151
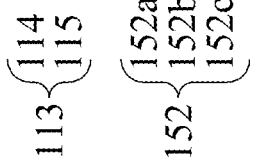
113 { 114 115
152 { 152a 152b 152c
FIG. 15
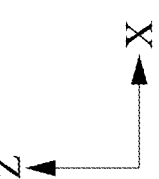
X
Z

106

201

322

321

203

331

12

106

SEMICONDUCTOR STRUCTURES AND METHOD FOR MANUFACTURING A SEMICONDUCTOR STRUCTURE

CROSS REFERENCE

This application claims the benefit of prior-filed U.S. provisional application No. 63/490,768, filed on Mar. 16, 2023, which is incorporated by reference in its entirety.

TECHNICAL FIELD

The present disclosure relates to a semiconductor structure, and more particularly, to a semiconductor structure having a die-stacking structure.

DISCUSSION OF THE BACKGROUND

As the artificial intellectual (AI) models have been applied to more and more fields, a demand for suitable hardware having greater computation capability also raises. Since the AI models usually require large amounts of parallel computing, most of the computation hardware includes multiple cores, which requires large circuit area. Furthermore, to improve the computation efficiency, data sharing and/or data switching among different cores is also desired. However, to enable data sharing and/or data switching, connections between cores can be complicated and require even larger area. Therefore, providing a semiconductor structure that can facilitate greater computation capability within a smaller area or thickness has become an issue to be solved.

SUMMARY

One embodiment of the present disclosure discloses a semiconductor structure. The semiconductor structure includes a substrate, a through via penetrating the substrate, a trench capacitor, a first redistribution layer (RDL), a second RDL, and a contact feature. The trench capacitor extends from a back surface toward a front surface of the substrate, wherein the trench capacitor is separated from an active area at the front surface of the substrate. The first RDL is disposed over the front surface and electrically connecting to the through via, wherein the active area is disposed between the trench capacitor and the first RDL. The second RDL is disposed over the back surface and electrically connecting to the through via and the trench capacitor. The contact feature is disposed over the first RDL and electrically connecting to the trench capacitor through the first RDL, the through via and the second RDL.

Another embodiment of the present disclosure discloses a method for manufacturing a semiconductor structure. The method includes several operations: receiving a substrate, having an active area at a front surface of the substrate; forming a first via structure extending from the front surface and penetrating the active area, wherein a depth of the first via structure is substantially greater than a depth of the active area; forming a first redistribution layer (RDL) over the front surface of the substrate; reducing a thickness of the substrate, thereby exposing a bottom surface of the first via structure, wherein a back surface of the substrate substantially aligned to the bottom surface of the first via structure is generated; forming a trench capacitor extending from the back surface toward the front surface of the substrate, wherein the active region is between the trench capacitor and the first RDL, and a bottom of the trench capacitor is separated from the active area; and forming a second RDL over the back surface of the substrate to electrically connecting the first via structure and the trench capacitor.

The semiconductor structure and the method for manufacturing the semiconductor structure adopts the die-stacking structure to accommodate multiple core dies within one package. The die-stacking structure not only allows greater computation capability within a smaller area but also enables faster data sharing and/or data switching.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIGS. 1 to 7 are schematic diagrams of cross sections of a semiconductor structure at different stages of a manufacturing method in accordance with some embodiments of the present disclosure.

FIGS. 8 to 15 are enlarged views of a portion of the semiconductor structure indicated by a dotted contour in FIG. 7 at different stages of the manufacturing method in accordance with some embodiments of the present disclosure.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

FIGS. 1 to 29 are schematic diagrams of a semiconductor structure at different stages of a manufacturing method in accordance with some embodiments of the present disclosure.

Figure 1:
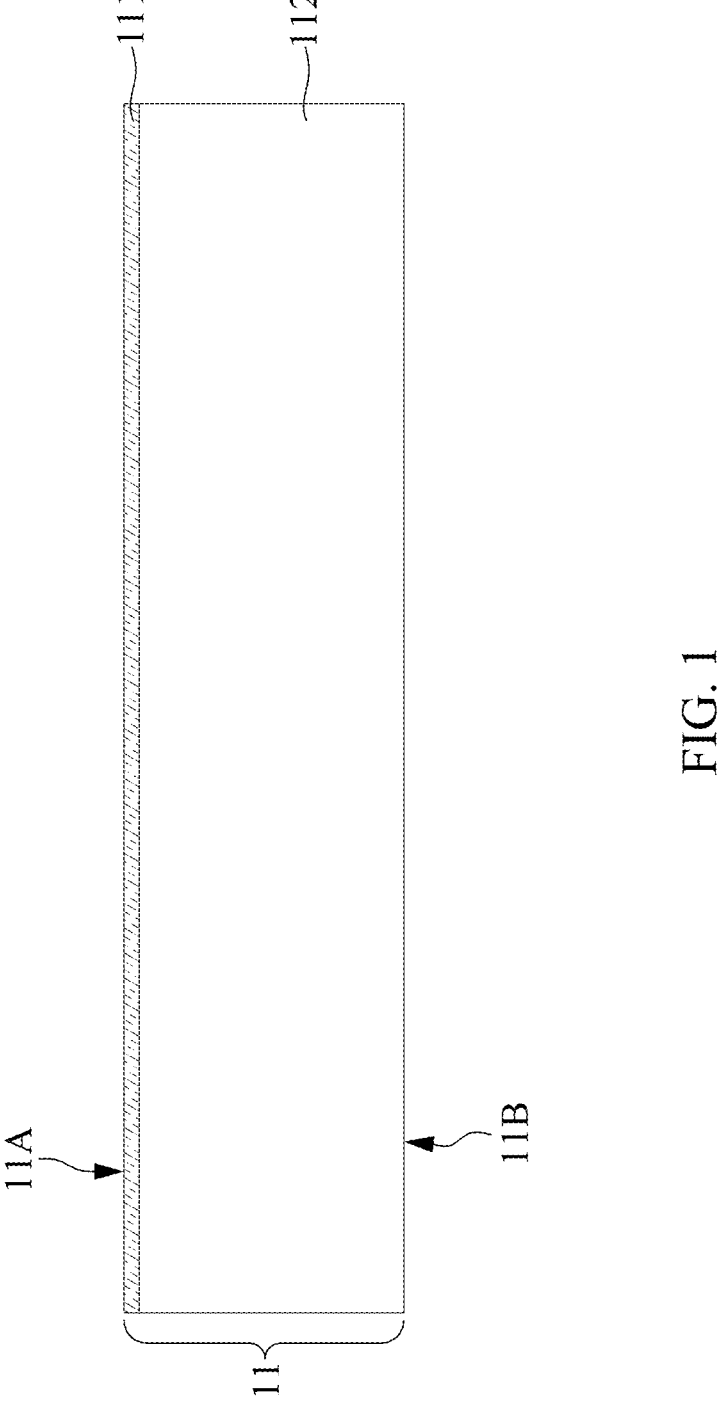
Figure 1:
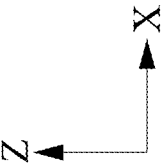

Referring to FIG. 1, a substrate 11 is received, provided, or formed. The substrate 11 includes a first surface (or a front surface) 11A and a second surface (or a back surface) 11B opposite to the first surface. In some embodiments, the substrate 11 includes a bulk semiconductor material, such as silicon. The substrate 11 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, a thickness of the substrate 11 at this stage is about 775 microns (μm).

An active area 111 can be formed or defined in the substrate 11 at the first surface 11A. The active area 111 may be of a first conductivity type, e.g., a P-type (acceptor type) doping area, or of a second conductivity type, e.g., an N-type (donor type) doping area. In some embodiments, the active area 111 may include a doped epitaxial layer, a gradient semiconductor layer, or a semiconductor layer overlaying another semiconductor layer of a different type, such as a silicon layer on a silicon germanium layer. A portion of the substrate below the active area can be intrinsic area or non-doping area. For a purpose of illustration, the portion of the substrate below the active area 111 is referred to as an intrinsic area 112. In addition, X and Z directions are depicted on the figures, wherein X direction define a horizontal direction or a surface direction (e.g., an extending direction of the first surface 11A or the second surface 11B) of the substrate 11, and Z direction defines a direction that is normal to the surface of the substrate 11.

Figure 2:
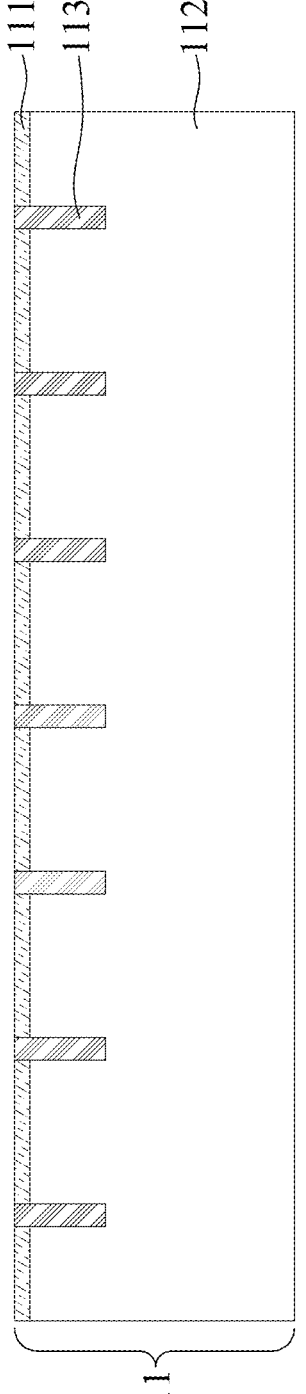
Figure 2:
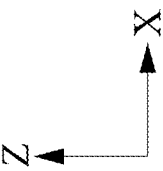

Referring to FIG. 2, a plurality of via structures 113 are formed in the substrate 11 in accordance with some embodiments of the present disclosure. Each of the via structures penetrates the active area 111. In other words, a depth of a via structure 113 is substantially greater than a depth of the active area 111 measured from the first surface 11A along the Z direction. In some embodiments, the depth of the via structure 113 is in a range of 5 to 30 μm. It should be noted that the via structures 113 can be formed prior to or after the formation of the active area 111 according to different applications.

Figure 3:
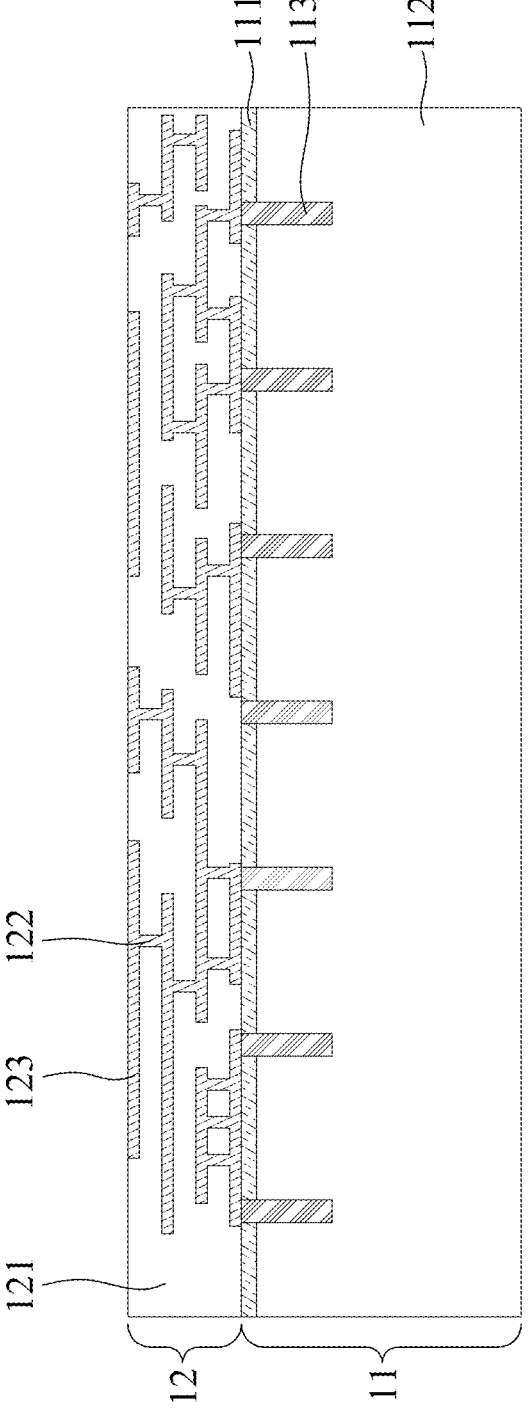
Figure 3:
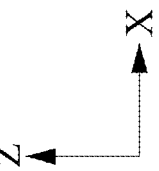

Referring to FIG. 3, a first redistribution layer (RDL) 12 is formed over the first surface 11A of the substrate 11 in accordance with some embodiments of the present disclosure. In some embodiments, the first RDL 12 covers an entirety of the active area 111. The first RDL 12 includes multiple metal line layers and multiple metal via layers arranged alternately between the metal line layers for electrical connection between the metal line layers. In some embodiments, each metal line layer is formed of metal lines 123 and an intermetal dielectric (IMD) layer 121 surrounding the metal lines 123. In some embodiments, each metal via layer is formed of metal vias 122 and an IMD layer 121 surrounding the metal vias 122. A number of the metal line layers of the first RDL 12 can be adjusted according to different applications, and it is not limited herein.

It should be noted that the figures are for a purpose of illustration of the present disclosure, and some details of a semiconductor structure may be omitted from the figures for a purpose of simplicity and clarity. For example, a plurality of electrical components are formed on the substrate 11 in the active area 111 prior to the formation or during formation of the first RDL 12. The electrical components can be active components or devices, and may include different types or generations of devices. In some embodiments, the electrical components can include a planar transistor, a multi-gate transistor, a gate-all-around field-effect transistor (GAAFET), a fin field-effect transistor (FinFET), a vertical transistor, a nanosheet transistor, a nanowire transistor, a passive device, a capacitor, a plurality thereof, or a combination thereof. In some embodiments, the electrical components are for processing information to complete a task, and the substrate 11 is referred to as a logic wafer. In some embodiments, the electrical components include memory cells (e.g., dynamic random access memory (DRAM) cells, static random access memory (SRAM) cell, and etc.). In some embodiments, the electrical components are for data storage, and the substrate 11 is referred to as a memory wafer. In some embodiments, an interconnect structure (not shown in the figures) can be formed over the substrate 11 prior to the formation of the first RDL. In some embodiments, the interconnect structure can be formed after or concurrently with the formation of the electrical components. The electrical components and the interconnect structure can be formed following conventional methods of manufacturing semiconductors. For ease of understanding and illustration, in the following description, the electrical components and the interconnect structure are considered as a part of the substrate 11, and the first RDL 12 are formed over the substrate 11 including those electrical components and the interconnect structure.

Figure 4:
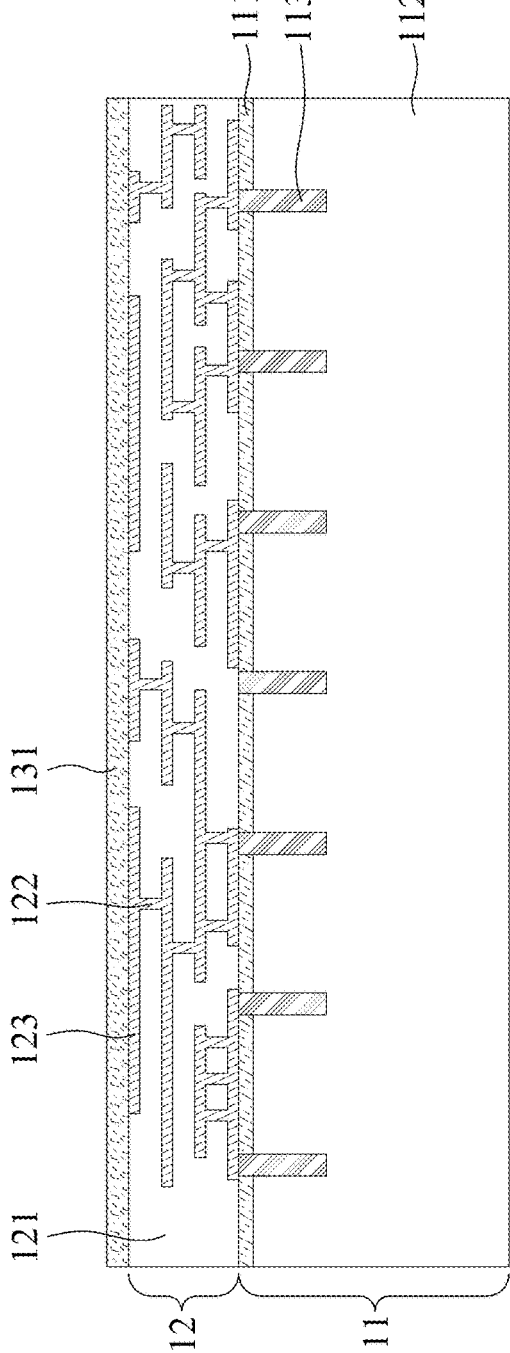
Figure 4:
Figure 4:
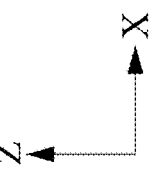

Referring to FIG. 4, a bonding layer 131 is formed over the first RDL 12 in accordance with some embodiments of the present disclosure. The bonding layer 131 may or may not include metallic material depending on different application. In some embodiments, a fusion bonding operation is to be performed, and the bonding layer 131 includes only dielectric material (e.g., oxide material or silicon oxide) as shown in FIG. 4. In other embodiments if a hybrid bonding operation is to be performed, the bonding layer 131 includes metallic material surrounded by dielectric material. A semiconductor structure 101 is generated as show in FIG. 4.

Figure 5:
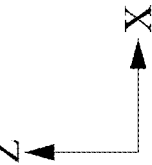

Referring to FIG. 5, the semiconductor structure 101 is flipped and placed over a substrate 102 in accordance with some embodiments of the present disclosure. In some embodiments, the substrate 102 is for a purpose of handling the semiconductor structure 101 during processing. In some embodiments, the substrate 102 is referred to as a handling substrate, a dummy substrate or a carrier substrate. In some embodiments, the substrate 102 is a bulk silicon substrate. In some embodiments, a bonding layer 132 is formed over the substrate 102 prior to a bonding operation to be performed. Similar to the bonding layer 131, the bonding layer 132 may or may not include metallic material according to the bonding operation to be performed. In some embodiments, the bonding layer 132 includes only dielectric material as shown in FIG. 5.

Referring to FIG. 6, the semiconductor structure 101 is moved toward and bonded to the substrate 102 in accordance with some embodiments of the present disclosure. In some embodiments, a fusion bonding operation is performed to bond the semiconductor structure 101 and the substrate 12. In some embodiments, an interface between the bonding layers 131 and 132 cannot be observed after the bonding operation. In some embodiments, the bonding layers 131 and 132 are fused to form a bonding layer 13. The second surface 11B of the substrate 11 is exposed and faces upward at this stage.

Referring to FIG. 7, a thickness of the substrate 11 is reduced, and bottoms of the via structures 113 are thereby exposed in accordance with some embodiments of the present disclosure. In some embodiments, a grinding operation followed by a polishing operation (e.g., chemical-mechanical polishing or CMP) is performed on the second surface 11B shown in FIG. 6, and a portion of the substrate 112 proximal to the second surface 11B is removed. In some embodiments, the thickness of the substrate 11 after the grinding and polishing operations are substantially equal to the depth of the via structure 113. In some embodiments, surficial portions of the via structures 113 are removed by the polishing operation for a purpose to ensure all the via structure are exposed. In some embodiments, the thickness of the substrate 11 after the polishing operation is slightly less than the depth of the via structure 113 shown in FIG. 2. In some embodiments, the thickness of the substrate 11 at the stage shown in FIG. 7 is in a range of 5 to 30 µm. A third surface 11B' being a new back surface of the substrate 11 is generated after the polishing operation, and the via structures 113 are through vias penetrating the substrate 11.

FIGS. 8 to 15 are enlarged views of a portion of the semiconductor structure indicated by a dotted contour in FIG. 7 at different stages of the manufacturing method in accordance with some embodiments of the present disclosure.

Figure 8:
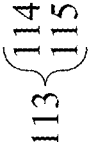
Figure 8:
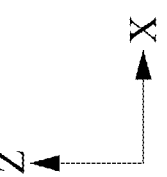

Referring to FIG. 8, as illustrated above and depicted in FIG. 7, a bottom surface 113B of the via structure 113 is exposed through the substrate 11. In some embodiments, the bottom surface 113B of the via structure 113 is substantially aligned to or coplanar with the third surface 11B' of the substrate 11. In some embodiments, a top surface 113A of the via structure 113 is substantially aligned to or coplanar with the first surface 11A of the substrate 11. The via structure 113 includes a via dielectric layer 114 and a via metal 115 surrounded by the via dielectric layer 114. In some embodiments, the via dielectric layer 114 is disposed between the via metal 115 and the substrate 11 to electrically isolate the via metal 115 from the substrate 11. In some embodiments, the via dielectric layer 114 laterally surrounds the via metal 115. A top surface of the via metal 115 is exposed through the via dielectric layer 114 at the first surface 11A of the substrate 11 for a purpose of electrical connection to the first RDL 12. A bottom surface of the via metal 115 is exposed through the via dielectric layer 114 at the third surface 11B' of the substrate 11 for a purpose of electrical connection to a second RDL 15 to be formed (as shown in FIG. 15).

Figure 9:
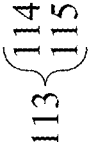
Figure 9:
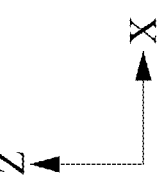

Referring to FIG. 9, a plurality of trenches T1 are formed in the intrinsic area 112 of the substrate 11 in accordance with some embodiments of the present disclosure. The plurality of trenches T1 define a position of a trench capacitor to be formed in the substrate 11. In some embodiments, the plurality of trenches T1 are disposed adjacent to a via structure 113. In some embodiments, the plurality of trenches T1 are disposed between two adjacent via structures 113 (not shown in FIG. 8 but shown in FIG. 28). In some embodiments, an etching operation is performed to form the plurality of trenches T1. In some embodiments, the etching operation is a time-mode etching operation and stops in the intrinsic area 112 prior to reaching the active area 111. An entirety of the trenches T1 are disposed in the intrinsic area 112 and separated from the active area 111. Dimensions of the trenches T1 can be adjusted according to different applications. In some embodiments, a width W1 of the trench T1 is in a range of 0.1 to 2 µm. In some embodiments, a depth D1 of the trench T1 along the Z direction is in a range of 2 to 20 µm. In some embodiments, a distance D11 between a bottom of the trench T1 and the active area 111 along the Z direction is in a range of 2 to 20 µm.

Figure 10:
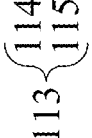
Figure 10:
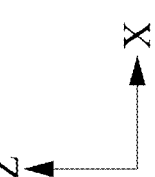

Referring to FIG. 10, a dielectric layer 141 are formed over the third surface 11B' of the substrate 11 in accordance with some embodiments of the present disclosure. The dielectric layer 141 is conformal to a profile of the trenches T1. In some embodiments, the dielectric layer 141 covers the third surface 11B' of and lines the trenches T1. A temperature of a deposition of the dielectric layer 141 is controlled to be lower than a default temperature so as to prevent damage to the electrical components (e.g., transistors, capacitors and/or memory cells) formed on the substrate 11 or alternation of electrical properties of the elements (e.g., silicon germanium regions, metal lines and/or metal vias) from high temperature of processing. In some embodiments, a temperature of the deposition of the dielectric layer 141 is substantially lower than 300 degrees Celsius (C). In some embodiments, the deposition includes atomic layer deposition (ALD). In some embodiments, a plasma enhanced atomic layer deposition (PEALD) is performed to from the dielectric layer 141. For a purpose of electrical isolation, a dielectric material of the dielectric layer 141 can be selected according to a required specification. The dielectric layer 141 can include a suitable dielectric material, such as silicon oxide $(SiO_x)$, silicon nitride $(Si_xN_y)$, silicon oxynitride (SiON), other low-k dielectric materials, high-k dielectric materials, or a combination thereof.

Figure 11:
Figure 11:
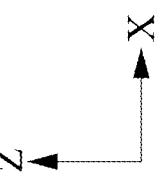

Referring to FIG. 11, a conductive layer 142 are formed over and conformal to the dielectric layer 141 in accordance with some embodiments of the present disclosure. The conductive layer 142 can include a suitable conductive material titanium (Ti), tantalum (Ta), erbium (Er), yttrium (Y), ytterbium (Yb), europium (Eu), terbium (Tb), lutetium (Lu), thorium (Th), scandium (Sc), hafnium (Hf), zirconium (Zr), terbium (Tb), alloys thereof, or a combination thereof. In some embodiments, the conductive layer 142 at least includes titanium. Similar to the illustration above, for a purpose of prevention of damage to the electrical components or alternation of electrical properties of the elements already formed, temperatures of operations in the following processing are controlled to be lower than 300° C. In some embodiments, the conductive layer 142 is formed by a sputtering operation or PEALD.

Figure 12:
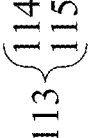
Figure 12:
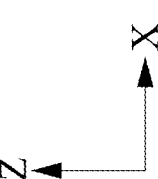
Figure 13:
Figure 13:
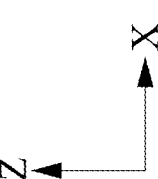

Referring to FIGS. 12 and 13, a dielectric layer 143 and a conductive layer 144 are sequentially formed over the conductive layer 141 in accordance with some embodiments of the present disclosure. Formation of the dielectric layer 143 can be similar to the formation of the dielectric layer 141, and formation of the conductive layer 144 can be similar to the formation of the conductive layer 142. Repeated description is omitted herein for a purpose of simplicity. The dielectric layer 143 is an insulator of a capacitor, and a material and a thickness of the dielectric layer can be adjusted according to a desired capacitance of the capacitor. The conductive layers 142 and 144 are electrodes of the capacitor. In some embodiments, the conductive layers 142 and 144 are made of a same material. In some embodiments, the conductive layer 144 fills the trenches T1 as shown in FIG. 13.

Figure 14:
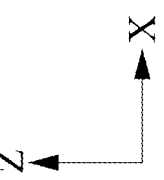

Referring to FIG. 14, one or more patterning operations are performed to remove portions of the dielectric layers 141 and 143 and portions of the conductive layers 142 and 144 in accordance with some embodiments of the present disclosure. In some embodiments, a portion of the conductive layer 141 is exposed through the dielectric layer 143 and the conductive layer 144 for electrical connection to the second RDL to be formed (as shown in FIG. 15). In some embodiments, the bottom surface 113B of the via structure 113 (especially the bottom surface of the via metal 115) is exposed through the dielectric layer 141 for electrical connection to the second RDL to be formed (as shown in FIG. 15). It should be noted that configurations of the dielectric layers 141 and 143 and the conductive layers 142 and 144 from a top view perspective can be adjusted according to different specifications, and it is not limited herein. A capacitor structure 14 including the conductive layers 142 and 144 and the dielectric layer 143 after the patterning operation(s) is thereby formed. In some embodiments, the capacitor structure 14 is referred to as a deep trench capacitor (DTC). In some embodiments, the conductive layer 142 is referred to as a bottom (or lower) electrode of the capacitor structure 14, and the conductive layer 144 is referred to as a top (or upper) electrode of the capacitor structure 14.

Referring to FIG. 15, the second RDL 15 is formed over the third surface 11B' of the substrate 11 in accordance with some embodiments of the present disclosure. Similar to the first RDL 12 as depicted in FIG. 2, the second RDL 15 includes multiple metal line layers and multiple metal via layers arranged alternately between the metal line layers for electrical connection between the metal line layers. In some embodiments, each metal line layer is formed of metal lines 153 and an intermetal dielectric (IMD) layer 151 surrounding the metal lines 153. In some embodiments, each metal via layer is formed of metal vias 152 and an IMD layer 151 surrounding the metal vias 152. The conductive layers 142 and 144 electrically connect to different via structures 113 through the second RDL. For example, the metal vias 152 includes at least one metal via 152a disposed between and connecting the via metal 115 and a metal line 153, and the metal vias 152 may include at least one metal via 152b disposed between and connecting the conductive layer 144 and the same metal line 153, thereby electrically connecting the conductive layer 144 and the via structure 113. Similarly, the metal vias 152 may include at least one metal via 152c disposed between and connecting the conductive layer 142 and another metal line 153 to electrically connecting the conductive layer 142 to another via structure 113 (not shown in FIG. 15 but can be seen in FIG. 28).

Figure 16:
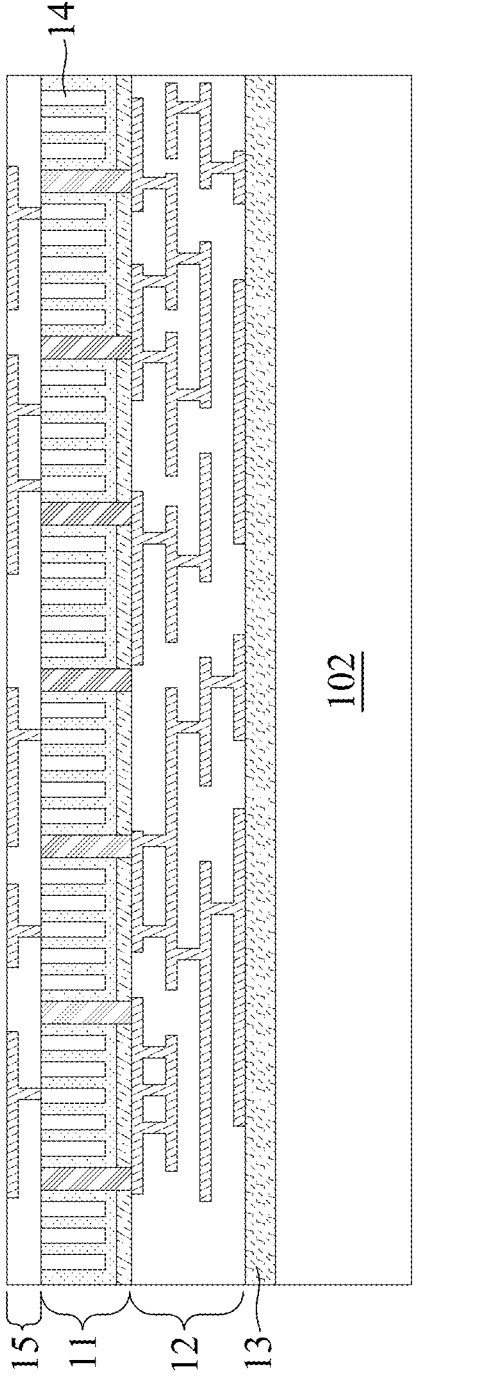
FIGS. 16 to 27 are schematic diagrams of cross sections of a semiconductor structure at different stages of a manufacturing method in accordance with some embodiments of the present disclosure.

FIG. 16 is a schematic diagram of the semiconductor structure from a perspective the same as that of FIG. 7 at the stage as shown in FIG. 15. The first RDL 12 and the second RDL 15 are disposed on two opposite sides of the substrate 11. In some embodiments, the substrate 102 remains attached on under the first RDL 12 through the bonding layer 13.

Figure 17:
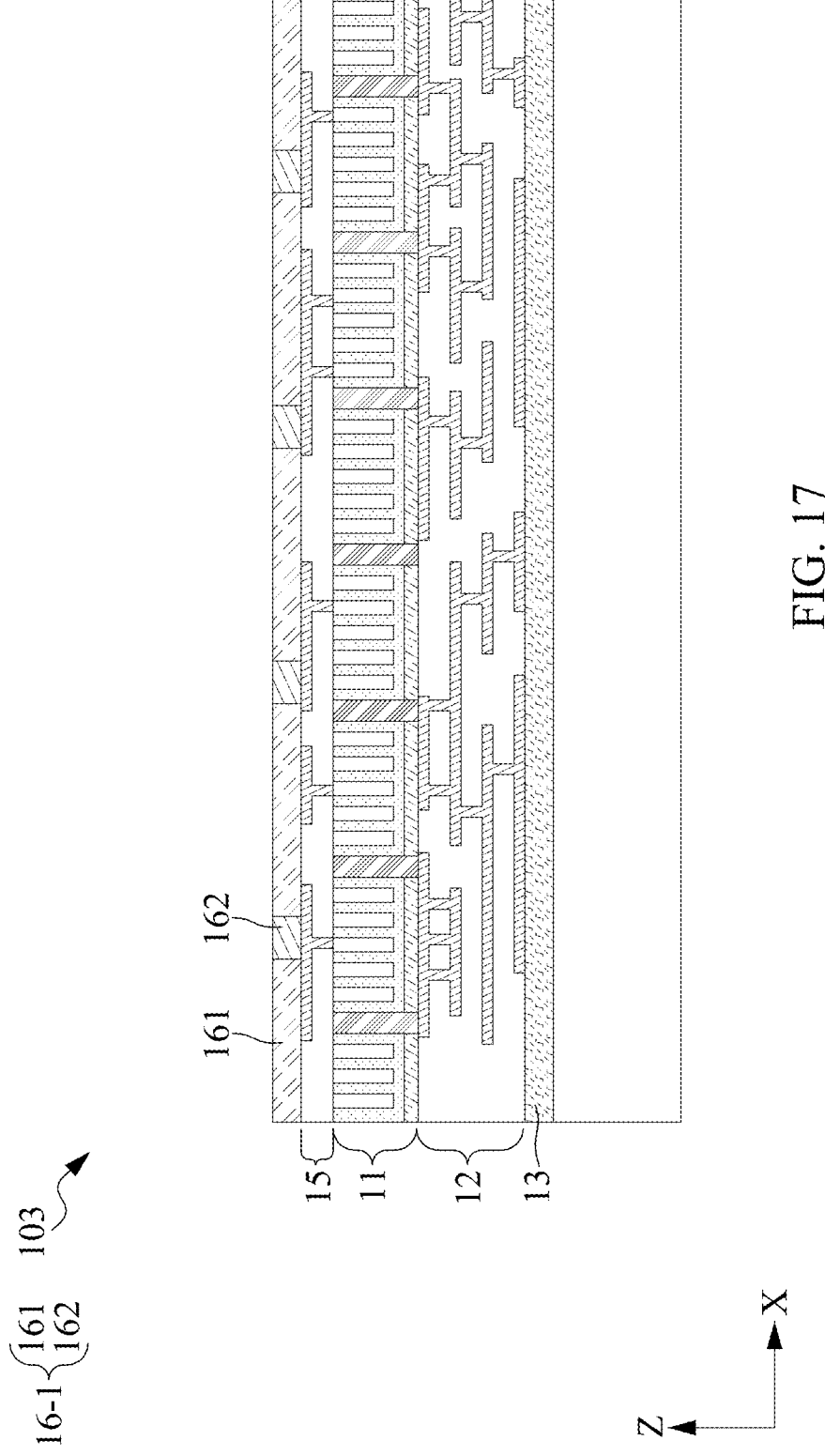

Referring to FIG. 17, a bonding layer 16-1 is formed over the second RDL 15 in accordance with some embodiments of the present disclosure. In some embodiments, a hybrid bonding operation is to be performed, and the bonding layer 16-1 includes a dielectric portion 161 and a metallic portion 162 surrounded by the dielectric portion 161. In some embodiments, the metallic portion 162 is exposed through the dielectric portion 161. However, as illustrated above, materials of a bonding layer is depends on the bonding operation to be performed, and the present disclosure is not limited thereto the hybrid bonding operation. A semiconductor structure 103 is thereby formed.

Figure 18:
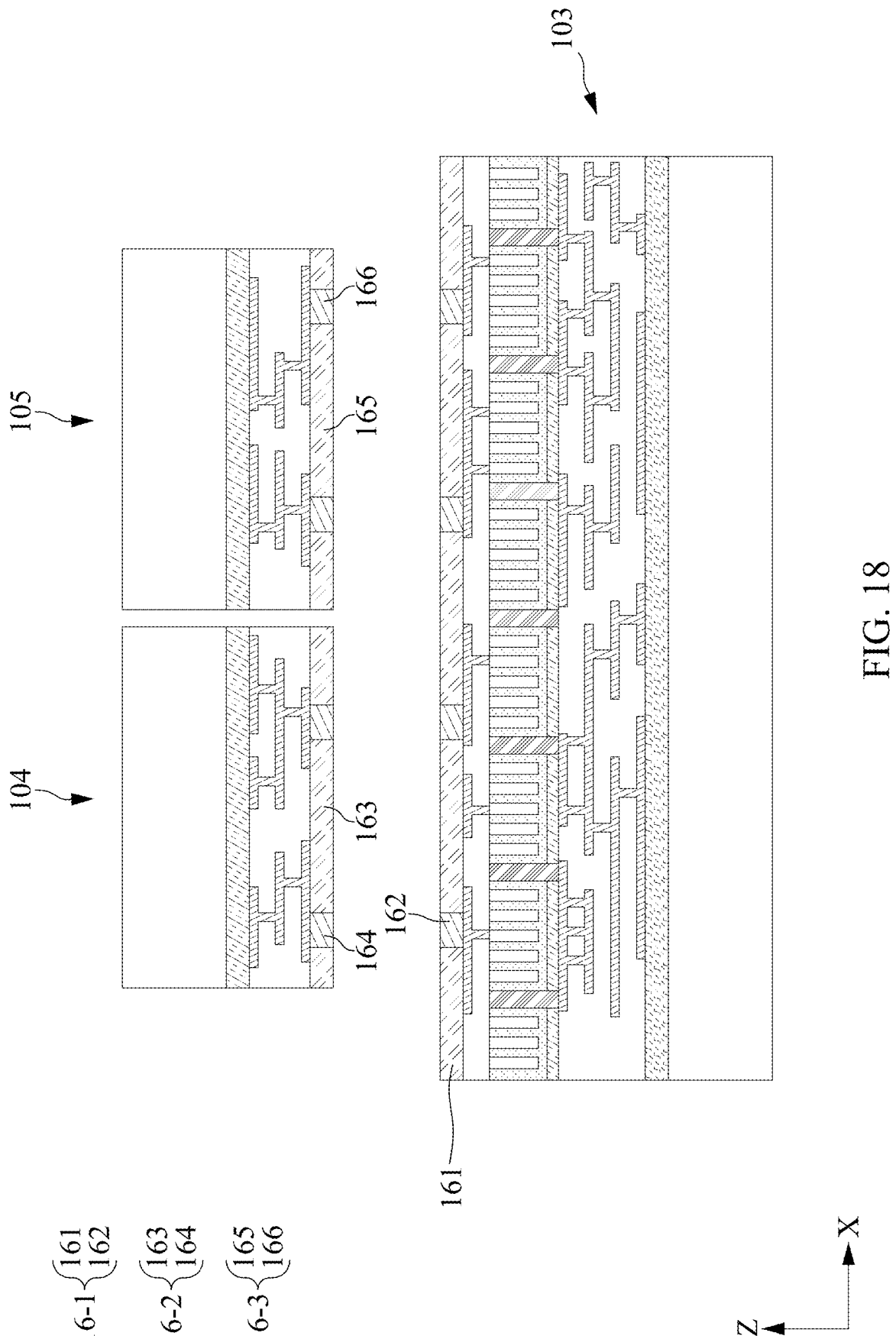

Referring to FIG. 18, a first chip (or first die) 104 and a second chip (or second die) 105 are moved over the semi-conductor structure 103 in accordance with some embodiments of the present disclosure. The first chip 104 includes a bonding layer 16-2 including a dielectric portion 163 and a metallic portion 164, and the second chip includes a bonding layer 16-3 including a dielectric portion 165 and a metallic portion 166. In some embodiments, the first chip 104 or the second chip 105 is formed in another camber or another fabrication (FAB) site. The first chip 104 or the second chip 105 can formed following a similar process as depicted in FIGS. 1 to 4 without the formation of the via structures 113.

For a purpose of illustration, a side (or surface) of an active area (e.g., 111) of a substrate (or chip) is defined as the front side (or front surface) of the substrate (or chip), and the other side (or the other surface) opposite to the front side (or front surface) is defined as the back side (or back surface) of the substrate (or chip). In some embodiments, the bonding layer 16-2 is at a front surface of the first chip 104, and the front surface of the first chip 104 is placed to face the bonding layer 16-1 on a back side of the substrate 11. In some embodiments, the bonding layer 16-3 is at a front surface of the second chip 105, and the front surface of the second chip 105 is placed to face the bonding layer 16-1 on the back side of the substrate 11.

Figure 19:
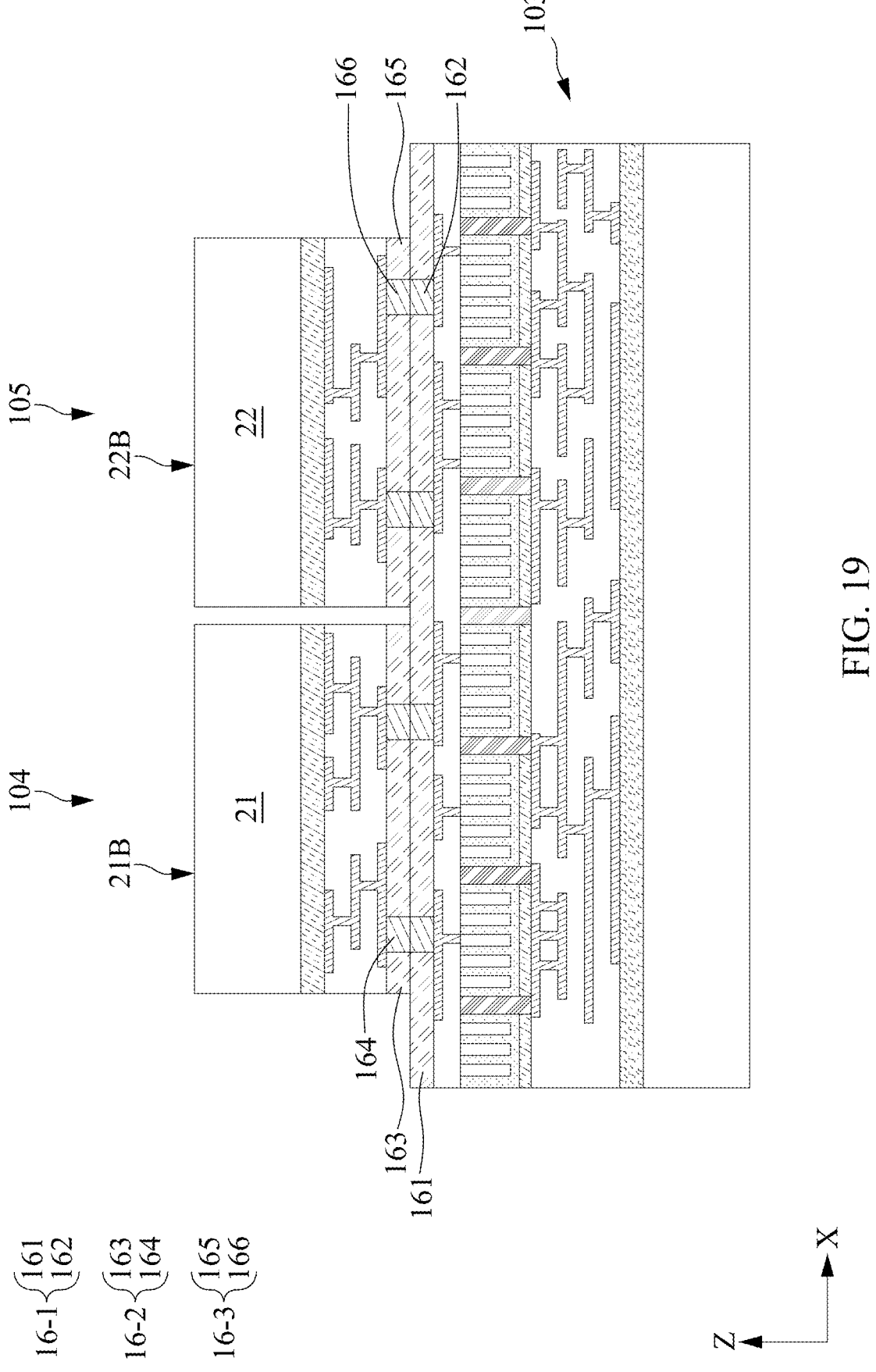

Referring to FIG. 19, the first chip 104 and the second chip 105 are moved toward and bonded to the semiconductor structure 103 in accordance with some embodiments of the present disclosure. In some embodiments, a hybrid bonding operation is performed to bond the first chip 104 and the semiconductor structure 103 and bond the second chip 105 and the semiconductor structure 103. The first chip 104 and the second chip 105 can be bonded to the semi-conductor structure 103 concurrently by a same hybrid bonding operation or individually by sequentially performed hybrid bonding operations. In some embodiments, an inter-face is generated between the bonding layers 16-1 and 16-2 and can be observed by an electron microscopy (e.g., transmission electron microscopy (TEM) or scanning elec-tron microscope (SEM)). Similarly, in some embodiments, an interface is generated between the bonding layers 16-1 and 16-3 and can be observed by the electron microscopy (e.g., transmission electron microscopy (TEM) or scanning electron microscope (SEM)). A back surface 21B of the first chip 104 and a back surface 22B of the second chip 105 are exposed at the stage shown in FIG. 19.

Figure 20:
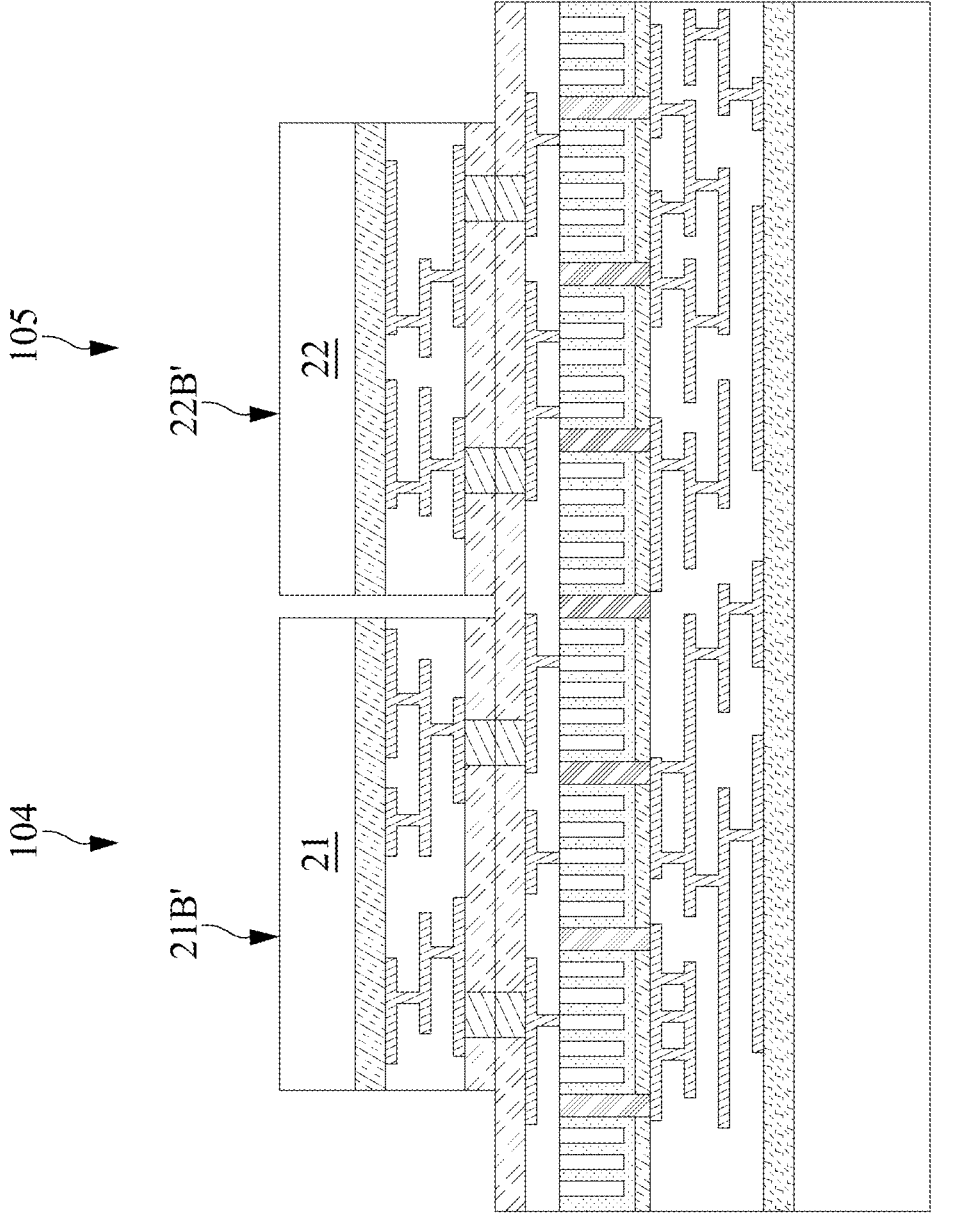
Figure 20:
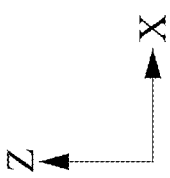

Referring to FIG. 20, a thickness of a substrate 21 of the first chip 104 and a thickness of a substrate 22 of the second chip 105 are reduced in accordance with some embodiments of the present disclosure. In some embodiments, a portion of the substrate 21 proximal to the back surface 21B is removed, and a portion of the substrate 22 proximal to the back surface 22B is removed. In some embodiments, the portion of the substrate 21 and the portion of the substrate 22 are removed by a grinding operation, and the back surfaces of the substrate 21 and 22 are relabeled to be a back surface 21B' and a back surface 22B' respectively after the opera-tions as depicted in FIG. 20.

Figure 21:
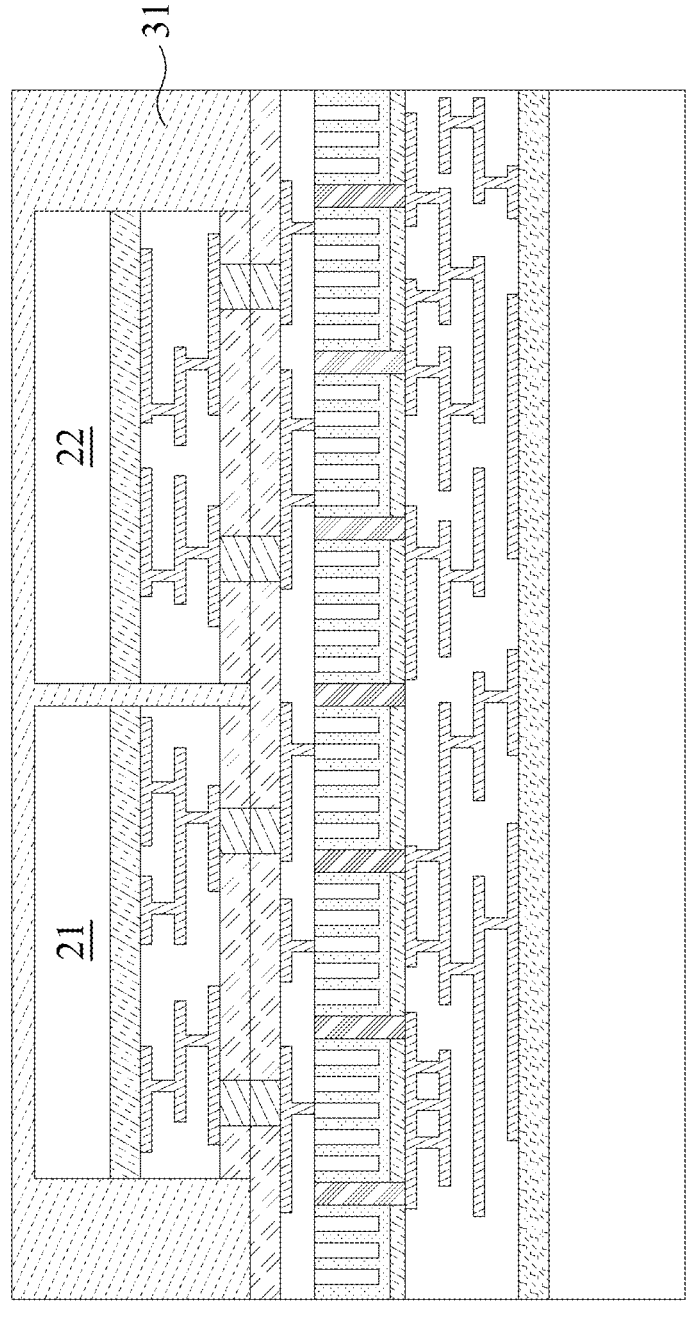
Figure 21:
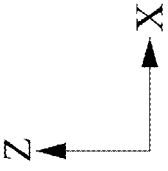

Referring to FIG. 21, a dielectric layer 31 is formed to cover the first chip 104 and the second chip 105 and filling a gap there in-between in accordance with some embodi-ments of the present disclosure. The dielectric layer 31 can be referred to as a molding layer 31, or a gap fill layer 31. In some embodiments, the dielectric layer 31 includes tetraethoxysilane (TEOS). Other suitable molding materials can be applied, and it is not limited herein.

Figure 22:
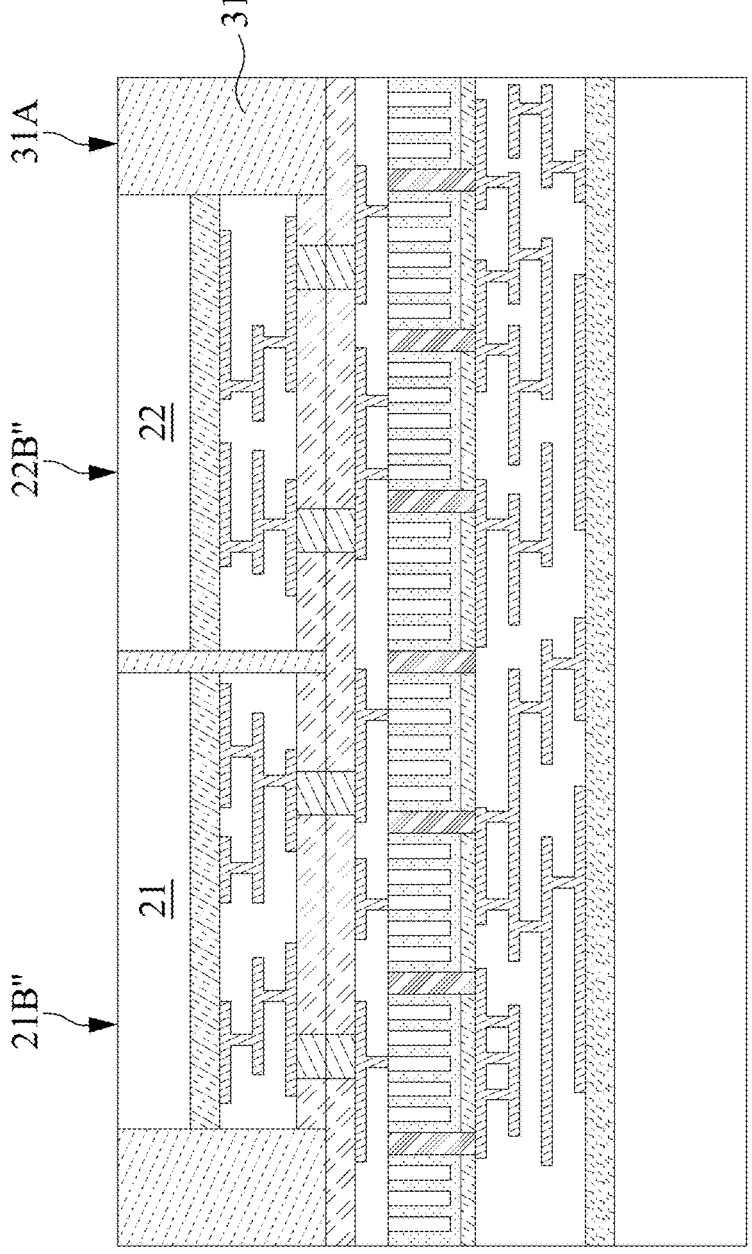
Figure 22:
Figure 22:
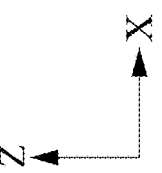

Referring to FIG. 22, a surficial portion of the interme-diate structure of FIG. 21 is removed reduced in accordance with some embodiments of the present disclosure. For a purpose of further reduce the thicknesses of the chips 104 and 105, the surficial portion of the intermediate structure of FIG. 21 is removed. In some embodiments, a portion of the substrate 21 proximal to the back surface 21B is removed, and a portion of the substrate 22 proximal to the back surface 22B is removed. The portion of the substrate 21 and the portion of the substrate 22 can be removed by a grinding operation, a polishing operation (e.g., CMP), an etching operation, or a combination thereof. In some embodiments, a grinding operation followed by a polishing operation (e.g., CMP) is performed. A portion of the dielectric layer 31 covering the back surface 21B' and the back surface 22B' shown in FIG. 21 is removed. In some embodiments, the grinding and polishing operations are performed on the back surface 21B', and the back surfaces of the substrate 21 and 22 are relabeled to be a back surface 21B" and a back surface 22B" respectively after the operations as depicted in FIG. 22. The back surfaces 21B" and 22B" of the substrates 104 and 105 are exposed through the dielectric layer 31. In some embodiments, the back surfaces 21B" and 22B" of the substrates 104 and 105 are substantially coplanar to a top surface of the dielectric layer 31. A bonded structure 201 is thereby formed as shown in FIG. 22.

Figure 23:
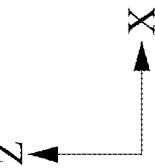

Referring to FIG. 23, a bonding layer 321 is formed over the bonded structure 201, and a substrate 106 is placed over bonded structure 201 in accordance with some embodiments of the present disclosure. The substrate 106 is for a purpose of handling the semiconductor structure 101 during processing, similar to the substrate 102. In addition, as illustrated above, a material of a bonding layer depends on a bonding operation to be performed. In some embodiments, a bonding layer 322 is formed over the substrate 106 prior to the bonding operation to be performed. In some embodiments, the bonding layers 321 and 322 individually include only dielectric material.

Figure 24:
Figure 24:
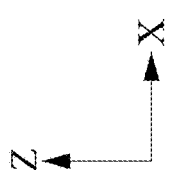

Referring to FIG. 24, the substrate 106 is moved toward and bonded to the bonded structure 201 in accordance with some embodiments of the present disclosure. In some embodiments, a fusion bonding operation is performed to bond the substrate 106 and the bonded structure 201. In some embodiments, an interface between the bonding layers 321 and 322 cannot be observed (e.g., by TEM or SEM) after the bonding operation. In some embodiments, the bonding layers 321 and 322 are fused to form a bonding layer 32. A bonded structure 202 is thereby formed as shown in FIG. 24.

Figure 25:
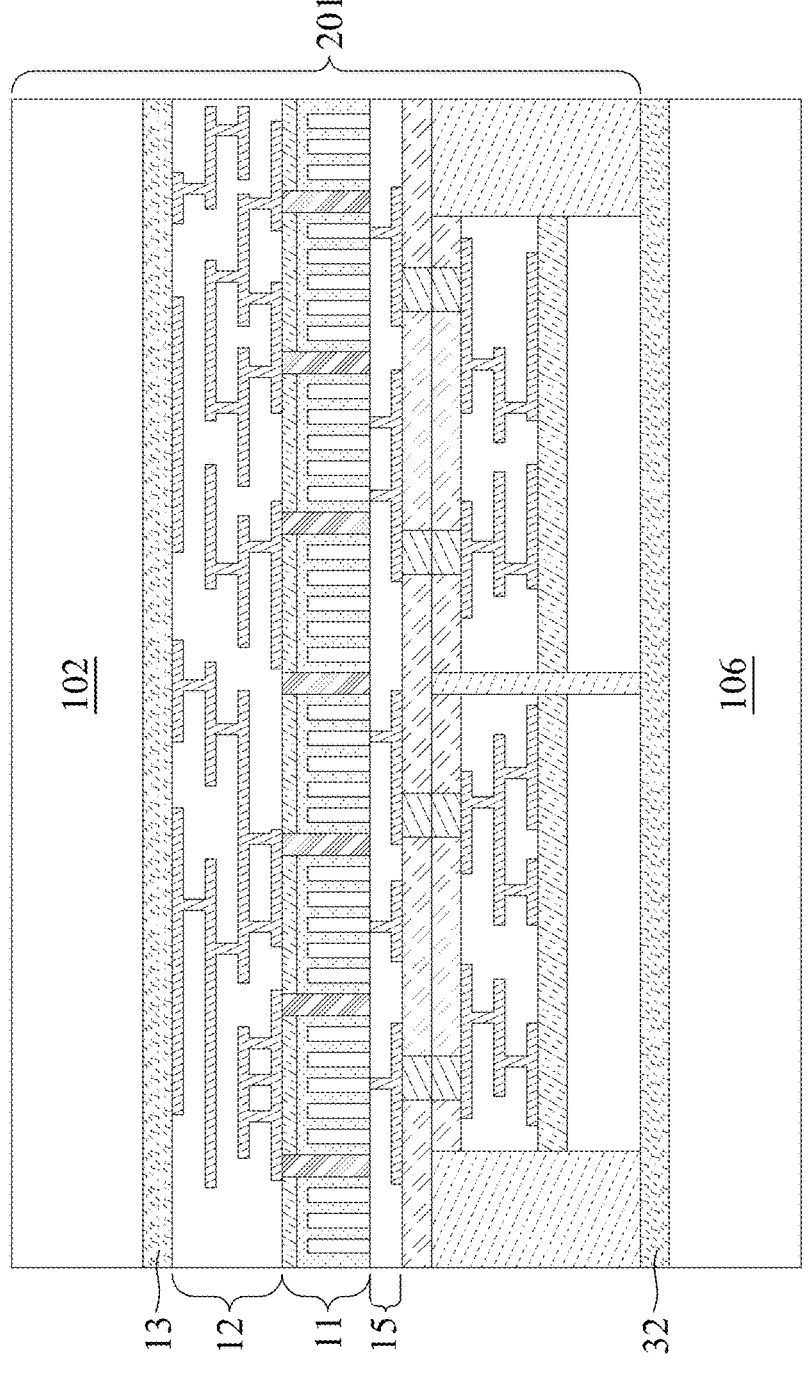
Figure 25:
Figure 25:
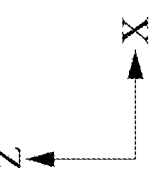
Figure 26:
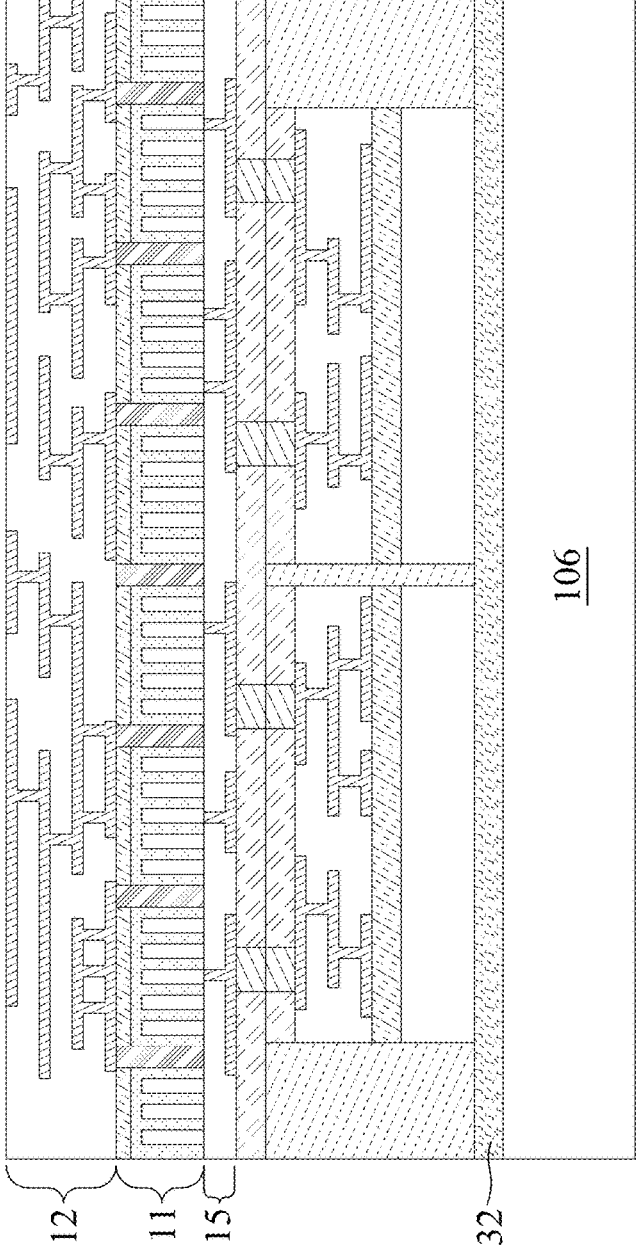
Figure 26:
Figure 26:
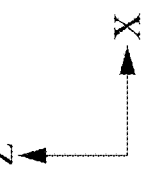

Referring to FIGS. 25 and 26, the bonded structure 202 is flipped over as shown in FIG. 25, and the substrate 202 and the bonding layer 13 of the bonded structure 202 are removed as shown in FIG. 26 in accordance with some embodiments of the present disclosure. The bonded structure 202 is flipped over, and the substrate 102 of the bonded structure 202 is placed upward. The substrate 102 is then de-attached from the first RDL 12. A top metal line layer of the first RDL 12 is exposed at a front side of the substrate 11.

Figure 27:
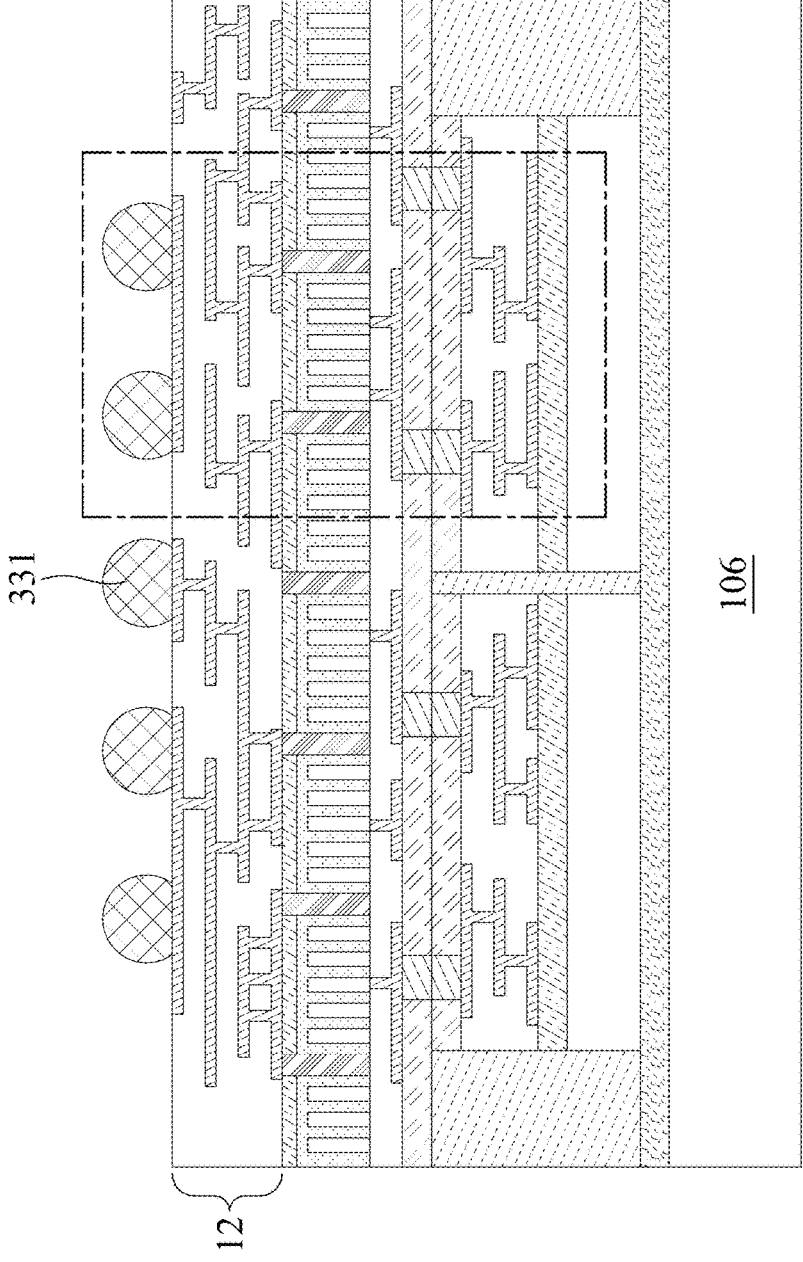
Figure 27:
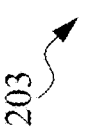
Figure 27:
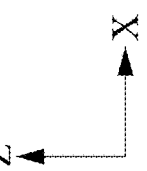

Referring to FIG. 27, a plurality of contact features 331 are formed over the first RDL 12 in accordance with some embodiments of the present disclosure. The contact features 331 electrically connects the top metal line layer of the first RDL 12. In some embodiments, a passivation layer (not shown in FIG. 27) is formed over the first RDL 12, and the passivation layer is patterned to exposed portions of metal lines of the top metal line layer for electrical connection to the contact features 331. In some embodiments, the contact features 331 are solder bumps. The contact features 331 can be lead (Pb) solders, Pb-free solders, or a tin-silver solder on a copper pillar. In some embodiments, the contact features 331 together are a ball grid array (BGA). In some embodiments, the contact features 331 includes bonding pad metals (BPM) and bonding pad vias (BPV). In some embodiments, the contact features 331 are formed by a series of operations, including a seed-layer formation, a plating operation, and a re-flow operation. A semiconductor structure 203 is thereby formed.

Figure 28:
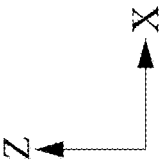
FIG. 28 is an enlarged view of a portion of the semiconductor structure indicated by a dotted contour in FIG. 27 in accordance with some embodiments of the present disclosure.

FIG. 28 is an enlarged diagram of a portion of the semiconductor structure indicated by a dotted contour in FIG. 27 in accordance with some embodiments of the present disclosure. It should be noted that FIG. 28 is for a purpose of illustration of electrical connections between the contact features 331 and the trench capacitor. Elements shown in FIG. 28 can be dramatically depicted for a purpose of illustration but not to indicate relative dimension scales between the elements.

For a purpose of illustration, the reference numbers front of underscore marks represent similar elements as illustrated in other figures, and the numbers 1, 2, 3, . . . etc. after the underscore marks represent different units of a group of elements. For example, the via structures 113 includes a via structure 113_1 and a via structure 113_2. The metal vias 152a represent those vias in the second RDL 15 connecting to the bottom of the via structures 113, and the metal vias 152a includes vias 152a_1 and 152a_2 connecting to different via structures 113_1 and 113_2. The metal vias 152b represent those vias in the second RDL 15 connecting to the capacitor structure 14, and the metal vias 152b includes vias 152b_1 and 152b_2 connecting to different electrodes (i.e., the conductive layers 142 and 144) of the capacitor structure 14. The metal lines 153 includes metal lines 153a and metal lines 153b in different metal line layers. The metal lines 153a represent those metal lines in a first metal line layer under the substrate 11, which also represent those metal lines connecting to the metal vias 152a. The metal line 153a_1 connects the metal via 152a_1 and the metal line 153a_2 connects to the metal via 153a_2. The metal lines 153b represent those metal lines in a bottommost metal line layer under the substrate 11, which also represent those metal lines connecting to the metal portions 164. The metal portions 164 includes a metal portion 164_1 connecting to a metal line 153b_1 of the metal lines 153b, and a metal portion 164_2 connecting to a metal line 153b_2 of the metal lines 153b. The conductive features 331 includes a conductive feature 331_1 and a conductive feature 331_2 providing different electrical paths.

As shown in FIG. 28, a first voltage (or a ground voltage) Vss is provided to the conductive layer 142 through the conductive feature 331_1, the first RDL 12, the via structure 113_1, the metal vias 152a_1, the metal line 153a_1, and the metal via 152b_1. The first voltage Vss can be provided from the front side of the substrate 11 and received by the conductive layer 142 at the back side of the substrate 11 through the via structure 113_1. Similarly, a second voltage (or a positive voltage) Vdd is provided to the conductive layer 144 through the conductive feature 331_2, the first RDL 12, the via structure 113_2, the metal vias 152a_2, the metal line 153a_2, and the metal via 152b_2. The second voltage Vdd can be provided from the front side of the substrate 11 and received by the conductive layer 144 at the back side of the substrate 11 through the via structure 113_2.

In addition, in order to improve signal transmission and operation speed, a distance D12 between the capacitor structure 14 and the substrate 21 should be as small as possible. In some embodiments, a distance D12 between the capacitor structure 14 and the substrate 21 is less than 50 μm. In some embodiments, the distance D12 is less than 30 μm. In some embodiments, the substrate 21 is a main processing unit (e.g., an intelligence processing unit (IPU)) of a semiconductor structure, and less distance D12 provides higher data transmission rate and lower signal loss. In some embodiments, a number of the metal line layers of the second RDL 15 between 1 to 5. In some embodiments, the number of the metal line layers of the second RDL 15 is equal to or less than 3.

Figure 29:
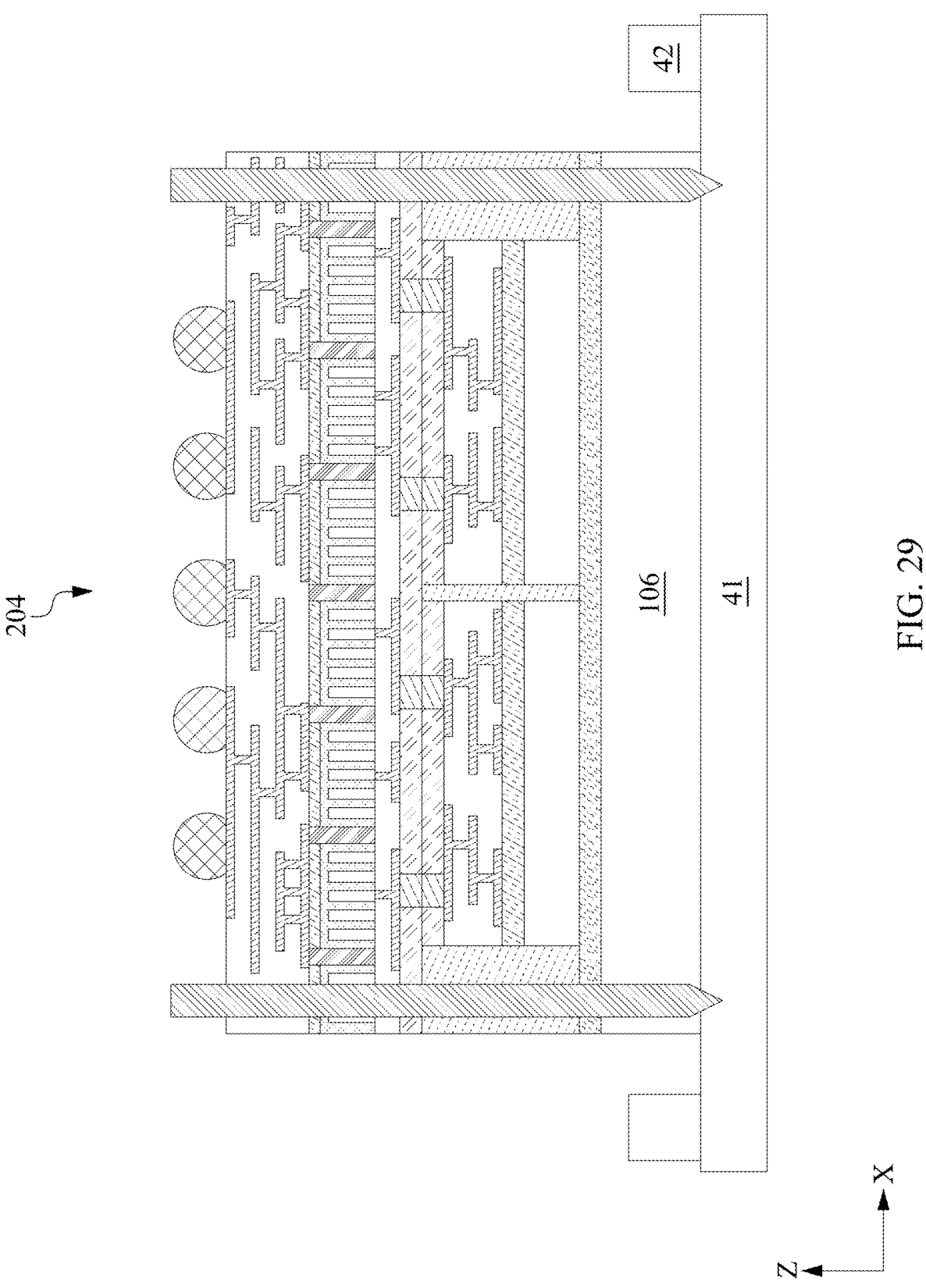
FIG. 29 is a schematic diagram of a semiconductor structure at a stage of a manufacturing method in accordance with some embodiments of the present disclosure.

Referring to FIG. 29, a dicing operation is performed to saw the semiconductor structure 203 multiple chips (or dies) 204 in accordance with some embodiments of the present disclosure. In some embodiments, the semiconductor structure 203 shown in FIG. 27 is mounted with a frame 42 and attached to a dicing tape 41 on a back surface of the substrate 106 prior to the dicing operation. The chip 204 can then be bonded to another substrate or an interposer before packaging.

Figure 30:
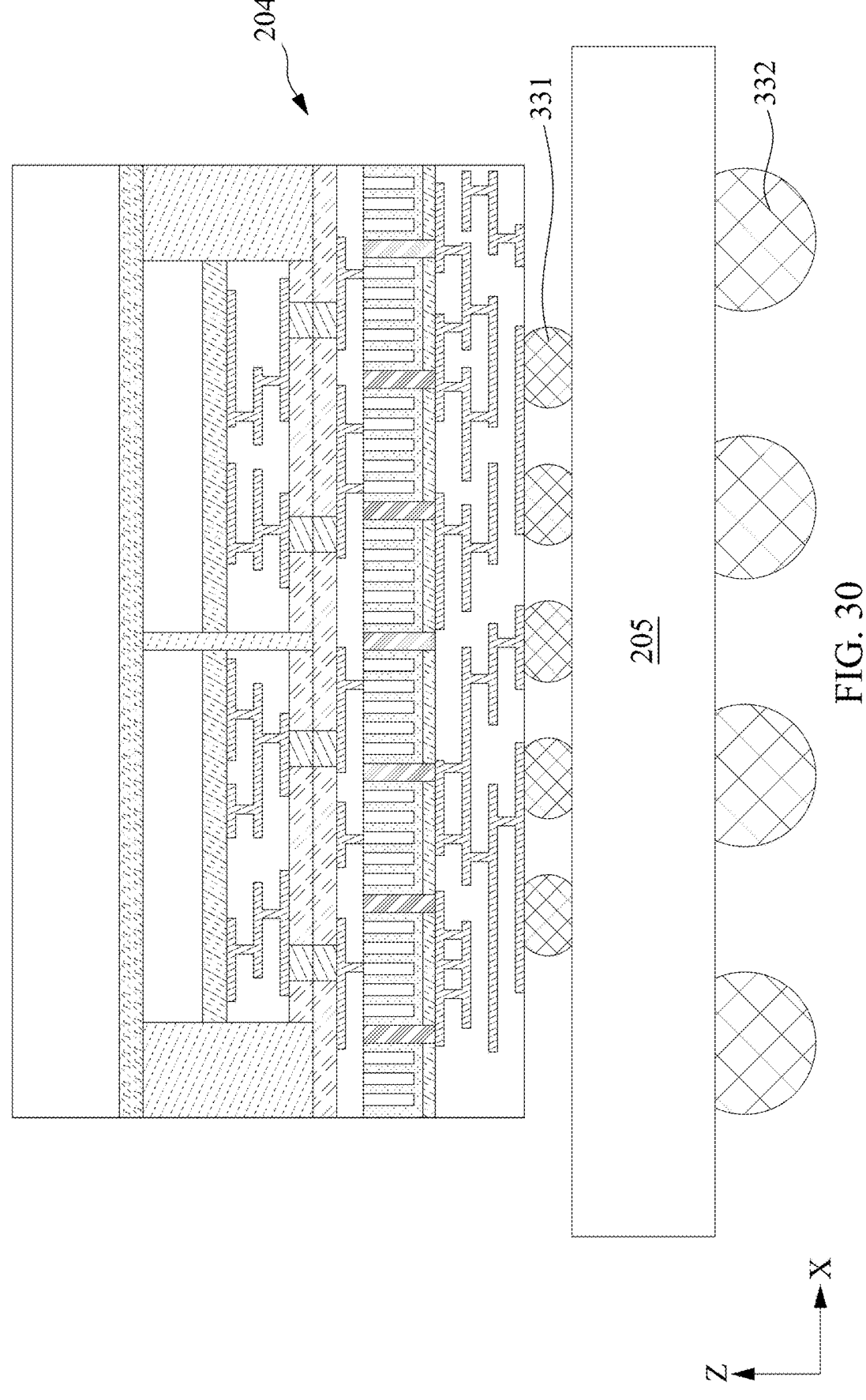
FIGS. 30 and 31 are schematic diagrams of stacked semiconductor structures in accordance with different embodiments of the present disclosure.

FIG. 30 is a schematic diagram of the chip 204 being bonded to a substrate 205 through the contact features 331 in accordance with some embodiments of the present disclosure. In some embodiments, the contact features 331 are in direct contact with the substrate 205, which includes a plurality of contact features 332 on a surface of the substrate 205 opposite to the contact features 331 for electrical connection to the chip 204 through the substrate 205. The substrate 205 can be a support substrate or a dummy silicon substrate.

Figure 31:
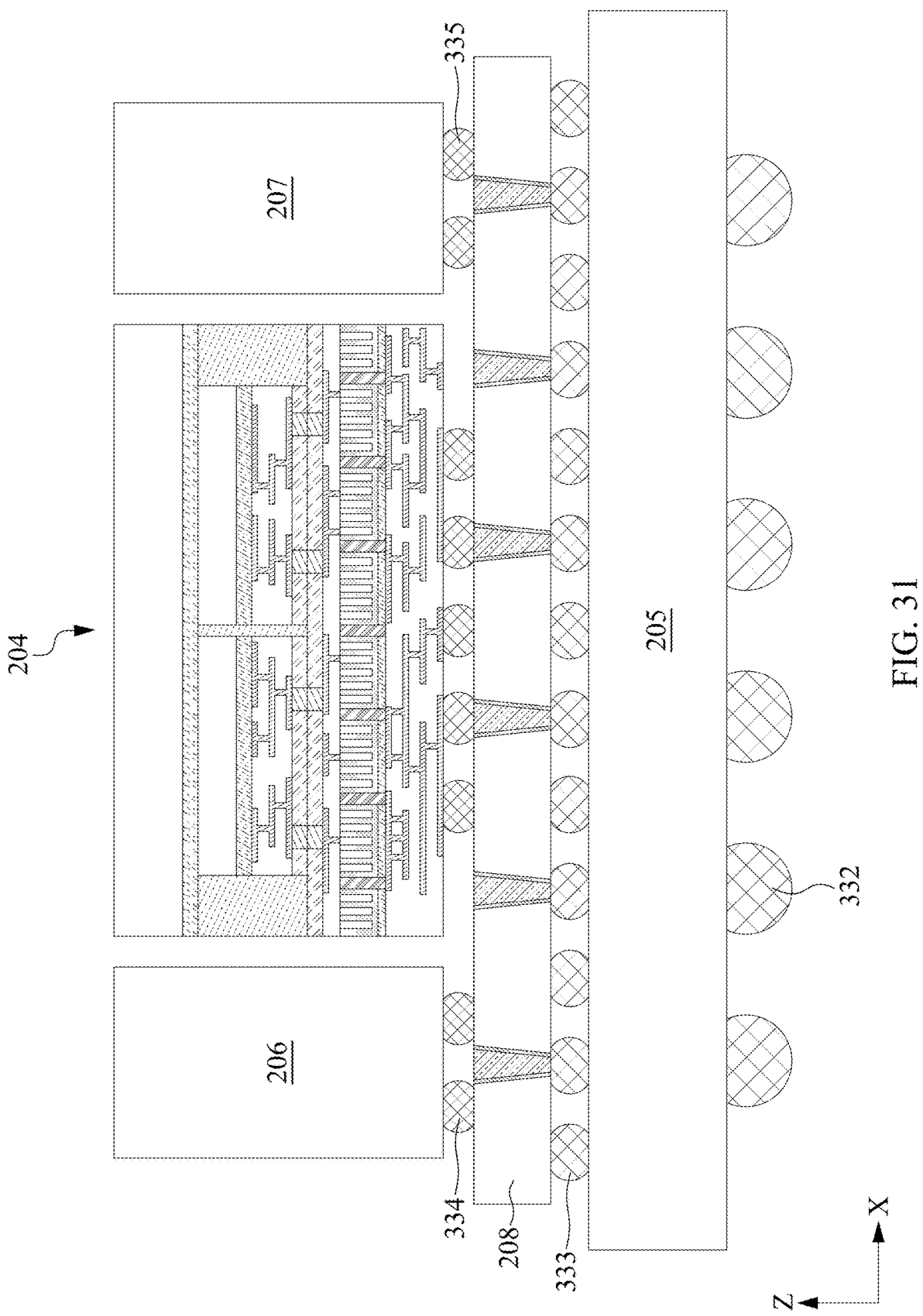

FIG. 31 is a schematic diagram of the chip 204 being electrically connected to the substrate 205 through an interposer 208 in accordance with some embodiments of the present disclosure. In some embodiments, the contact features 331 are in direct contact with the interposer 208. In some embodiments, the interposer 208 is bonded to the substrate 205 through the contact features 333 on a surface of the interposer 208. Other chips (or dies) may be placed adjacent to the chip 204 and bonded to the interposer 208. In some embodiments, high bandwidth memory (HBM) chips 206 and 207 are placed adjacent to the chip 204 and bonded to the interposer 208 through contact features 334 and 335.

A stacked semiconductor structure usually includes multiple chips or dies for different functioning. For a purpose of power integration of different chips, capacitor structures are introduced into an interposer, so called DTC interposer. DTC interposer provides an advantage of design flexibility of capacitance. However, a manufacturing cost is increased by application of a DTC interposer into a stacked semiconductor structure. In addition, a DTC interposer is bonded to a processing chip through a BGA, and a distance between the DTC interposer and the processing chip due to the presence of the BGA.

The present disclosure provides a semiconductor structure including a trench capacitor at a back side of a substrate. A wafer-on-wafer (WoW) or chip-on-wafer (CoW) can be achieved by fusion bond or hybrid bond, and thus a back-to-front bonding can minimize a distance between the trench capacitor in the substrate to a processing chip. In addition, the RDL (e.g., 15) at the back side of the substrate can be much simpler and have less metal lines compared to the RDL (e.g., 12) at a front side of the substrate since electrical paths in the RDL at the front side of the substrate more complicated. Therefore, the semiconductor structure of the present disclosure not only provides benefits on the capacitance same as those DTC interposer, but also have advantages of high transmission rate and lower signal loss due to a smaller distance between the capacitor and the processing chip. The semiconductor structure of the present disclosure with or without an interposer can have improvement on design flexibility of capacitance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure comprising:
a substrate, having a front surface, a back surface opposite to the front surface, and an active area at a front surface;
a through via, penetrating the substrate and having a top surface at the front surface of the substrate and a bottom surface at the back surface of the substrate;
a trench capacitor, extending from a back surface toward the front surface, wherein the trench capacitor is separated from the active area;
a first redistribution layer (RDL), disposed over the front surface of the substrate, and electrically connecting to the through via, wherein the active area is disposed between the trench capacitor and the first RDL;
a second RDL, disposed over the back surface of the substrate, and electrically connecting to the through via and the trench capacitor; and
a contact feature, disposed over the first RDL and electrically connecting to the trench capacitor through the first RDL, the through via and the second RDL.

2. The semiconductor structure of claim 1, wherein a depth of the trench capacitor is substantially less than a depth of the through via measured from the back surface of the substrate.

3. The semiconductor structure of claim 1, wherein the through via comprises a via dielectric layer and a via metal surrounded by the via dielectric layer.

4. The semiconductor structure of claim 3, wherein the via metal is electrically isolated from the active area by the via dielectric layer.

5. The semiconductor structure of claim 1, further comprising:
a bonding layer, disposed over the second RDL and comprising a dielectric material.

6. The semiconductor structure of claim 5, wherein the bonding layer further comprises a metallic material surrounded by the dielectric material and disposed at a surface of the bonding layer opposite to the second RDL.

7. The semiconductor structure of claim 1, wherein the second RDL comprises different conductive vias, and the trench capacitor includes a first electrode and a second electrode electrically connecting to the different conductive vias of the second RDL.

8. The semiconductor structure of claim 1, wherein the contact feature is a first contact feature of a plurality of contact features, the second RDL and the plurality of contact features are in a first chip, and the semiconductor structure further comprises:

a second chip, disposed over the second RDL and bonded to the first chip through a hybrid bonding layer.

9. The semiconductor structure of claim 8, further comprising:

a support substrate, disposed over the first RDL and electrically connecting the first chip through the plurality of contact features.

10. The semiconductor structure of claim 9, further comprising:

an interposer, disposed over the first RDL and bonded to the first chip through the plurality of contact features, wherein the support substrate electrically connects to the first chip through the interposer.

11. The semiconductor structure of claim 8, wherein the first chip is a memory chip, and the second chip is a logic chip.

12. The semiconductor structure of claim 8, wherein a distance between an active region of the second chip and the trench capacitor is less than 30 microns.

13. The semiconductor structure of claim 1, wherein the second RDL includes a plurality of metal line layers, and a number of the metal line layers is less than 5.

14. A semiconductor structure comprising:

a substrate, having a front surface, a back surface opposite to the front surface, and an active area at a front surface;

a through via, penetrating the substrate;

a trench capacitor, extending from a back surface toward the front surface, wherein the trench capacitor is separated from the active area;

a second redistribution layer (RDL), disposed over the back surface of the substrate, and electrically connecting to the through via and the trench capacitor; and a first chip disposed over the second RDL, comprising a first bonding layer disposed over a front surface of the first chip, wherein the front surface of the first chip faces the back surface of the substrate.

15. The semiconductor structure of claim 14, further comprising a second bonding layer between the second RDL and the first bonding layer.

16. The semiconductor structure of claim 14, further comprising a first RDL disposed over the front surface of the substrate, and electrically connecting to the through via.

17. The semiconductor structure of claim 16, further comprising a support substrate electrically connecting to the first RDL through a plurality of contact features.

18. The semiconductor structure of claim 16, further comprising an interposer between the first RDL and the support substrate, wherein the interposer is electrically connected to the first RDL and the support substrate.

19. The semiconductor structure of claim 14, the trench capacitor further comprises:

a first electrode configured to receive a first voltage; and a second electrode configured to receive a second voltage.

20. The semiconductor structure of claim 14, further comprising a dielectric layer disposed over the second RDL and surrounding the first chip.

* * * * *